United States Patent
Ihara

(10) Patent No.: US 7,972,149 B2
(45) Date of Patent: Jul. 5, 2011

(54) BOARD WITH CONNECTION TERMINALS

(75) Inventor: Yoshihiro Ihara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/856,940

(22) Filed: Aug. 16, 2010

(65) Prior Publication Data

US 2011/0053392 A1    Mar. 3, 2011

(30) Foreign Application Priority Data

Aug. 27, 2009  (JP) ................................ 2009-196287

(51) Int. Cl.
*H01R 12/00*  (2006.01)
(52) U.S. Cl. .......................................... 439/81; 439/66
(58) Field of Classification Search .................... 439/65, 439/66, 78, 81, 83
See application file for complete search history.

(56) References Cited

U.S. PATENT DOCUMENTS

| | | | | |
|---|---|---|---|---|
| 5,139,427 A | * | 8/1992 | Boyd et al. | 439/66 |
| 5,152,695 A | * | 10/1992 | Grabbe et al. | 439/71 |
| 7,264,486 B2 | | 9/2007 | Ma | |
| 7,497,694 B2 | * | 3/2009 | Kariya et al. | 439/66 |
| 7,621,761 B2 | * | 11/2009 | Mok et al. | 439/81 |

\* cited by examiner

*Primary Examiner* — Khiem Nguyen
(74) *Attorney, Agent, or Firm* — Kratz, Quintos & Hanson, LLP

(57) ABSTRACT

Connection terminals each include: a bonding portion bonded to a pad of a substrate; a contacting portion disposed to face the bonding portion; a spring portion present between the bonding portion and the contacting portion; and an engaging portion engaged with a portion of a slit provided in a plate-like member. These constituent portions of the connection terminal are formed integrally with each other. The plate-like member has recessed portions formed at predetermined positions, and the connection terminals are electrically connected to the pads of the substrate with the bonding portions of the connection terminals being locked to the recessed portions.

10 Claims, 13 Drawing Sheets

DIRECTION OF INSERTION

FIG. 3A
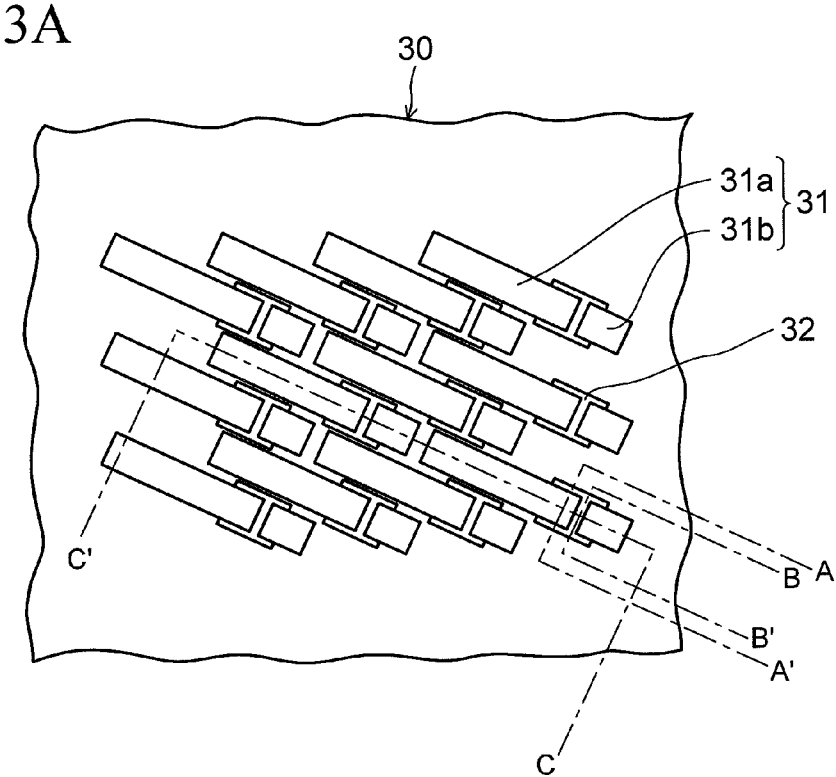
FIG. 3B
SECTIONAL VIEW ALONG A-A' LINE
FIG. 3C
SECTIONAL VIEW ALONG B-B' LINE
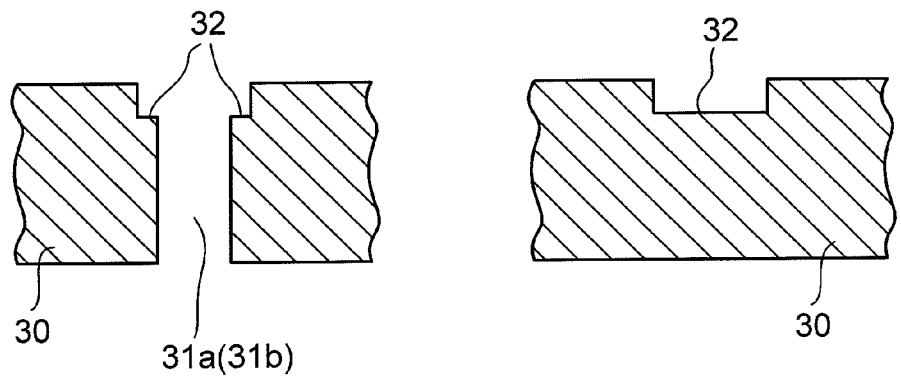

DIRECTION OF INSERTION

SECTIONAL VIEW ALONG A-A' LINE

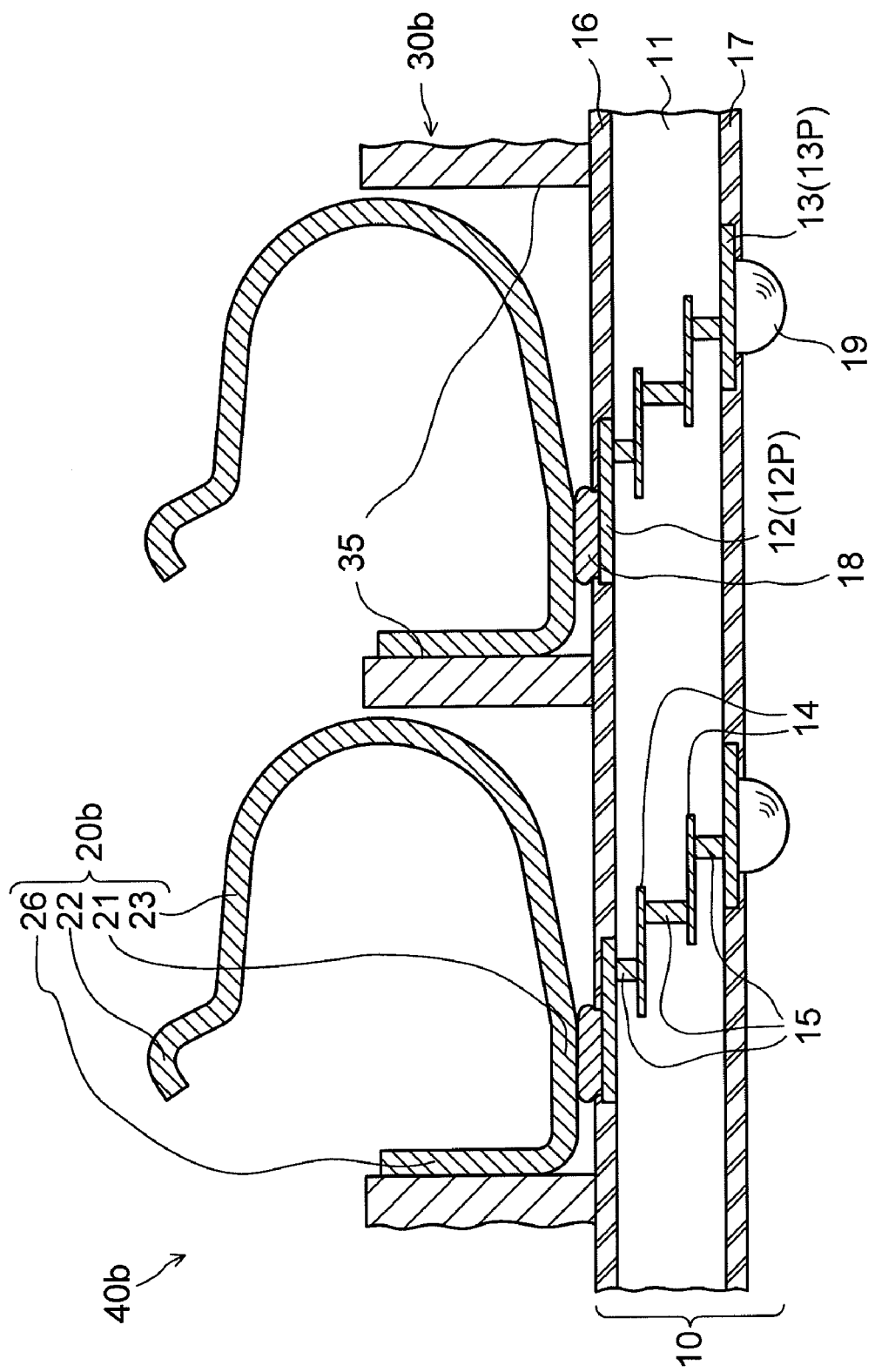

DIRECTION OF INSERTION

SECTIONAL VIEW ALONG A-A' LINE

BOARD WITH CONNECTION TERMINALS

CROSS-REFERENCE TO RELATED APPLICATIONS

This application is based on and claims priority of Japanese Patent Application No. 2009-196287 filed on Aug. 27, 2009, the entire contents of which are incorporated herein by reference.

BACKGROUND OF THE INVENTION (a) Field of the Invention

The present invention relates to a board having connection terminals, and more particularly to a board having springy connection terminals which are fixed to pads provided on a substrate, and which are used to establish electrical connection to an object to be connected such as an IC package by being pressed to pads provided on the object to be connected (hereinafter, the board is referred to as a "board with connection terminals").

(b) Description of the Related Art

For mounting an IC package or the like on a mounting board such as a printed wiring board, there are various methods of electrically connecting pads disposed on the package and pads disposed on the board.

Among the methods, there is a method called an LGA interconnection using an LGA (land grid array) socket. The LGA socket includes a plurality of elastically deformable and electrically conductive members (spring connection terminals) disposed between the package and the board. By interposing such spring connection terminals between the package and the board, an appropriate contact force is generated between pads of the package and pads of the board, and thus a stable electrical interconnection is secured.

As a technique related to such related art, there is a technique in which the mounting is performed by inserting one by one springy and electrically conductive terminals into an insulative housing of an LGA socket, as described in U.S. Pat. No. 7,264,486. In the mounting structure disclosed in U.S. Pat. No. 7,264,486, the spring connection terminals are fixed to through-holes formed in the housing, respectively, and each spring connection terminal includes a spring portion housed in the through-hole, and connecting portions continuous to upper and lower end portions of the spring portion, respectively. One of the connecting portions projects, together with a portion of the spring portion, from the top surface of the housing. The connecting portion provides the electrical connection between the connection terminal and the object to be connected by coming into contact with a surface of a pad, which is pressed on the connecting portion, of an object to be connected (for example, a wiring board).

Since the portion of the spring portion continuous to the connecting portion projects from the top surface of the housing, the projecting portion of the spring portion shifts (is displaced) mainly in a planar direction of the pad when the pad of the object to be connected is pressed on the connecting portion. This causes the connecting portion to shift (slip) on the surface of the pad at the time of being pressed by the pad.

As described above, in the case of the technique related to the related art board with connection terminals (U.S. Pat. No. 7,264,486), the projecting portion of the spring portion shifts in the plane direction of the pad when the pad of the object to be connected is pressed on the connecting portion. Hence, the connecting portion largely shifts (slips) on the surface of the pad. For this reason, the pad in the direction of the shift of the connecting portion needs to have a large width. This may lead to a disadvantage that the pads cannot be arranged at a narrow pitch.

The applicant of the present invention has proposed a technique to address the disadvantage (Japanese Patent Application No. 2009-128785 filed on May 28, 2009). The technique disclosed therein makes it possible to arrange the pads at a narrow pitch by forming each spring connection terminal into a specific shape.

In addition, the above-described related art (U.S. Pat. No. 7,264,486) is disadvantageous in terms of efficiency of mounting, because the mounting is performed by inserting the spring connection terminals one by one into the housing. In particular, under a situation where the demands for down-sizing and high density mounting have brought about arrangement of the terminals at an increasingly narrower pitch and an increase in the number of pins used, even the arrangement by the one-by-one insertion is difficult to perform, and the time and labor for the arrangement is increased with the increase in the number of the terminals. Accordingly, the above-described related art (U.S. Pat. No. 7,264,486) is further disadvantageous under such a situation.

As a countermeasure against this, a method is conceivable, for example, in which, for mounting a plurality of connection terminals on a housing, the plurality of connection terminals are aligned on a jig so as to meet the intended arrangement of terminals, the terminals are mounted by being transferred from the jig to the housing. In this method, it is necessary for the jig for the alignment to be provided with recessed portions for fixedly holding portions of terminals (end portions on the side opposite to the side of mounting on a board) so as to meet the intended arrangement of the terminals. The spring connection terminals are casted in the recessed portions, respectively.

The applicant of the present invention has proposed a technique embodying this method (Japanese Patent Application No. 2009-150587 filed on Jun. 25, 2009). The technique disclosed therein facilitates the casting of spring connection terminals to a jig by shaping each spring connection terminal into a specific shape. This method requires a jig for aligning the spring connection terminals. Here, it is desirable also from the viewpoint of simplifying the process if the connection terminals can be directly mounted on the board without the use of the jig. However, under the current situation where terminals are arranged at an increasingly narrower pitch and an increasingly larger number of pins are used, it is technically difficult to directly mount the connection terminals on the board. On the other hand, with the down-sizing being demanded, it becomes necessary to make the board itself as thin as possible. Here, since the thinning causes problems of warp, distortion, and the like, a certain countermeasure is required against the warp and the like, even if the connection terminals are directly mounted on the board.

SUMMARY OF THE INVENTION

An object of the present invention is to provide a board with connection terminals which makes it possible to arrange pads, to which connection terminals are connected, at a narrower pitch, and to make the board thinner, and which is capable of contributing to effective mounting of the connection terminals to the board by facilitating the alignment of the connection terminals while eliminating the need for a jig for the alignment of terminals.

According to one aspect of the invention, there is provided a board with connection terminals including: a board with connection terminals including: a substrate having pads provided on one surface thereof; connection terminals mounted on the substrate; and a plate-like member having slits into which the connection terminals are partially inserted, the plate-like member being provided on the one surface of the substrate and fixedly holding the connection terminals, wherein each of the connection terminals includes: a bonding portion bonded to one of the pads with an electrically conductive material; a contacting portion disposed to face the bonding portion; a spring portion present between the bonding portion and the contacting portion; and an engaging portion extending from the bonding portion and engaging with one of the slits provided in the plate-like member, and the contacting portion, the spring portion, the bonding portion and the engaging portion are formed integrally with each other from a metal plate, and wherein the plate-like member has a recessed portion formed by portions which extend in a long side direction of the slit and which face each other in a short side direction of the slit, and the connection terminal is electrically connected to the pad of the substrate with the bonding portion being locked to the recessed portion.

With the configuration of the board with connection terminals according to one aspect of the present invention, the contacting portion disposed to face the bonding portion comes into contact with the surface of the pad of the object to be connected, with the contacting portion being shifted in a direction toward the bonding portion (i.e., in a direction perpendicular to the surface of the pad with which the contacting portion comes into contact) by the deformation of the spring portion occurring when the pad is pressed on the contacting portion. This prevents the large shift (slippage), as encountered in the related art, of the contacting portions on the surfaces of the pads when the surfaces of the pads and the contacting portions come into contact with each other. Hence, the pads can be arranged at a narrow pitch.

Moreover, the structure is reinforced by providing the plate-like member onto the one surface of the substrate (by being integrated with the substrate). Hence, even when the thickness of the substrate on which the connection terminals are fixedly mounted is reduced, the occurrence of warp, distortion, and the like can be prevented. In other words, the substrate can be thinned without causing such disadvantages of warp and the like as those encountered in the related art.

Moreover, since the plate-like member, which is integrated with the substrate and functions as a reinforcing member, also functions as a jig for alignment of the terminals, it is possible to easily perform the alignment (the temporal fixation before the mounting on the substrate) of the connection terminals on the plate-like member. In other words, since the plate-like member on which the connection terminals are aligned is bonded as it is to the substrate, the connection terminals can be directly mounted on the substrate without using a jig for alignment of terminals, which is conventionally used. This contributes to the effective mounting of the connection terminals to the substrate.

BRIEF DESCRIPTION OF THE DRAWINGS

FIG. 2A is a perspective view thereof, and FIG. 2B is a side view thereof;

FIGS. 3A to 3C show a configuration of a housing (an insulative plate-like member) for temporarily fixing the connection terminals of FIGS. 2A and 2B, where FIG. 3A is a plan view viewed from a side from which the connection terminals are inserted, and FIGS. 3B and 3C are sectional views viewed along the line A-A' and the line B-B' in the plan view, respectively;

FIG. 9A is a perspective view thereof, and FIG. 9B is a side view thereof;

FIG. 10A is a plan view viewed from a side from which the connection terminals are inserted, and FIG. 10B is a sectional view viewed along the line A-A' in the plan view;

FIG. 11 is a sectional view showing a configuration of a board with connection terminals according to a third embodiment of the present invention;

FIG. 12A is a perspective view thereof, and FIG. 12B is a side view thereof;

FIG. 13A is a plan view viewed from the side from which the connection terminals are inserted, and FIG. 13B is a sectional view viewed along the line A-A' in the plan view.

DESCRIPTION OF THE PREFERRED EMBODIMENTS

Description is given below with regard to preferred embodiments of the present invention with reference to the accompanying drawings.

First Embodiment... see FIGS. 1 to 7

Figure 1:
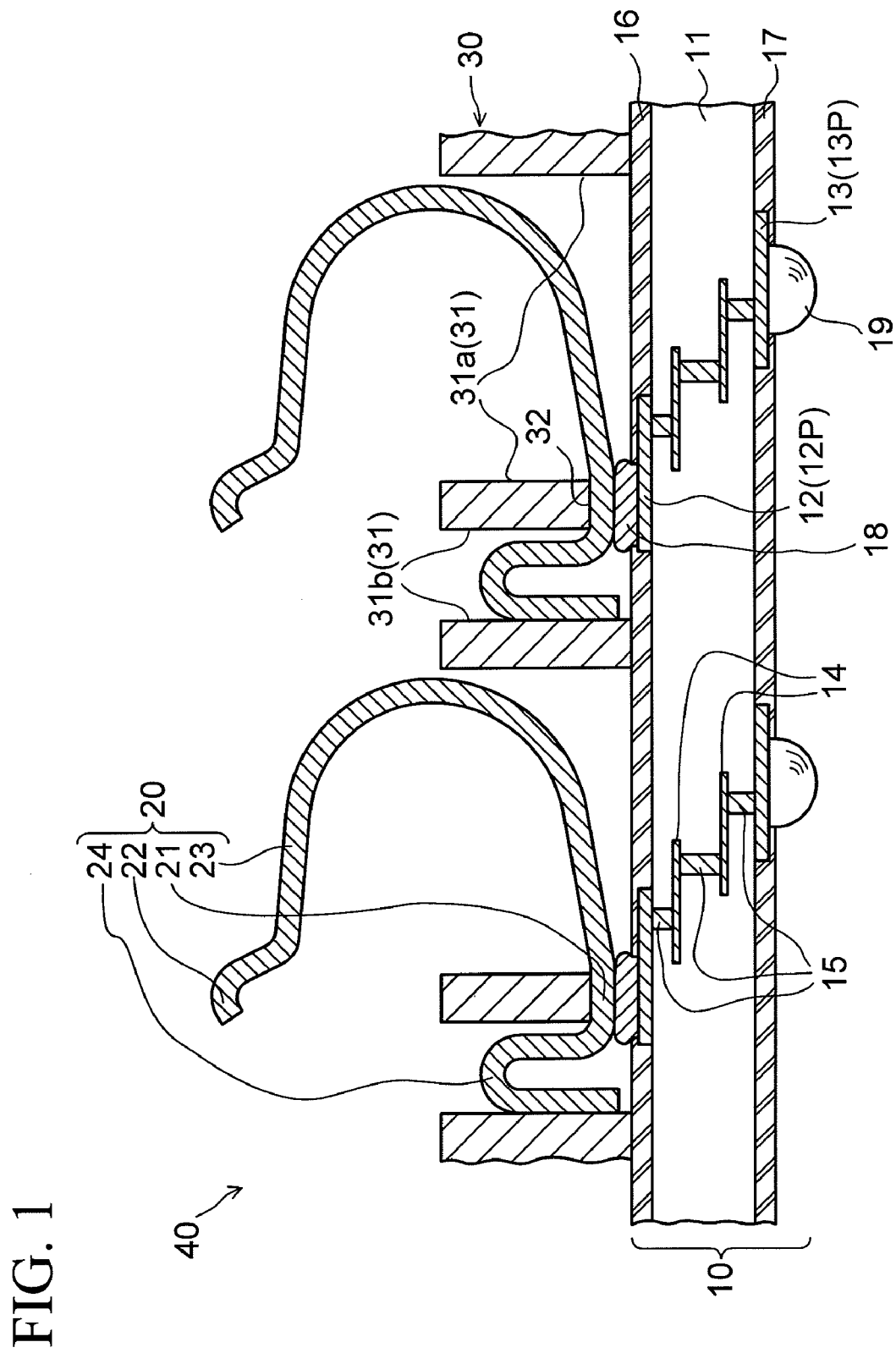
FIG. 1 is a sectional view showing a configuration of a board with connection terminals according to a first embodiment of the present invention.
Figure 2A:
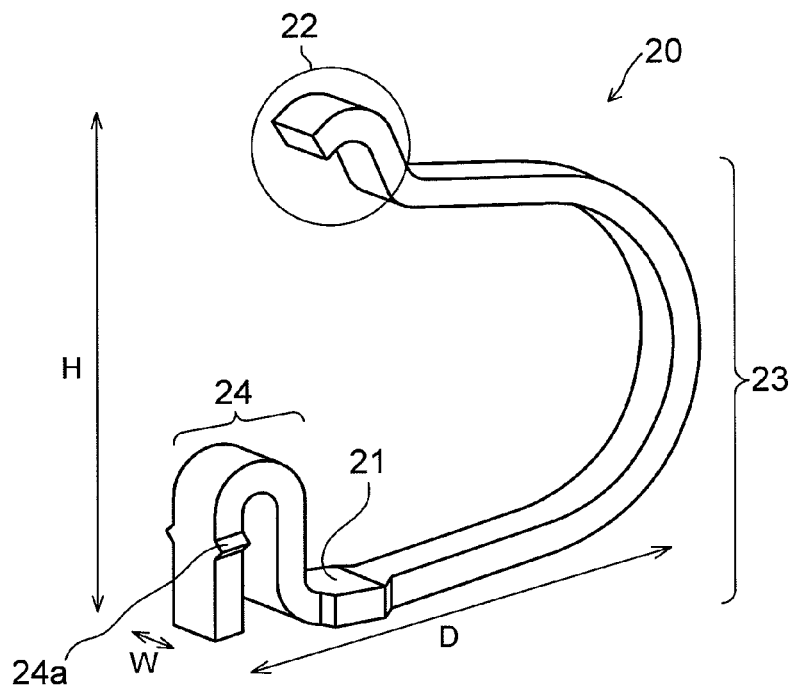
FIGS. 2A and 2B show a structure of the connection terminals used in the board with connection terminals shown in FIG. 1, where
Figure 2B:
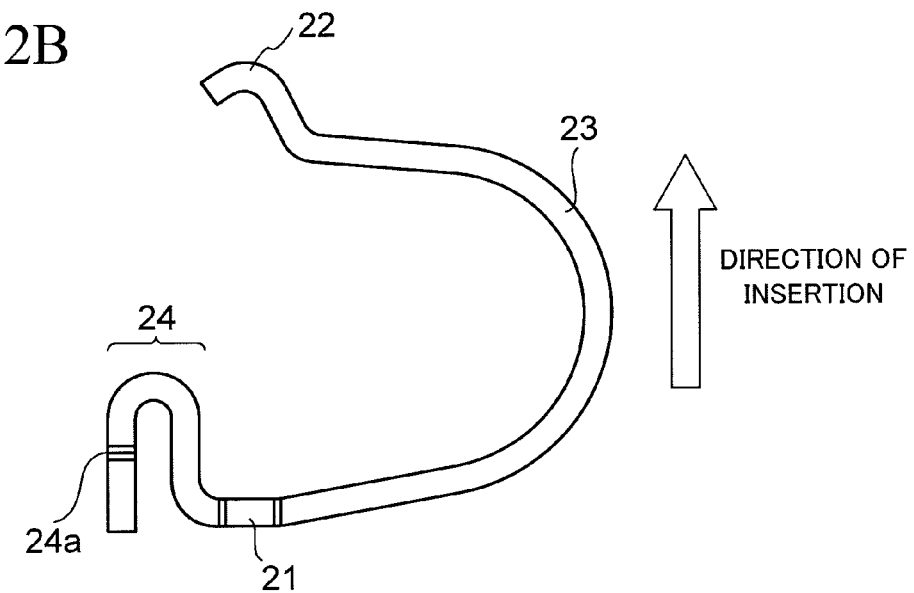

FIG. 1 shows in a sectional view a configuration of a board with connection terminals 40 according to a first embodiment of the present invention. FIGS. 2A and 2B show a structure of a connection terminal 20 used in the board with connection terminals 40, where FIG. 2A shows the shape of the connection terminal 20 viewed obliquely from above, and FIG. 2B shows the shape thereof in a side view.

The board with connection terminals 40 (FIG. 1) according to this embodiment includes a substrate 10, connection terminals 20, and a housing 30. The housing 30 is an insulative plate-like member and characterizes the present invention. The housing 30 is only partially shown in an example of FIG. 1. The housing 30 is configured to house an object to be connected (an LGA package in this embodiment) and to be disposed to face the board with connection terminals 40 as will be described later. As shown in FIG. 1, the housing 30 is integrated with the substrate 10, and constitutes a portion of a LGA socket (a portion corresponding to a bottom portion of the socket). In other words, the board with connection terminals 40 of this embodiment is incorporated in the LGA socket, and used to electrically connect pads provided to the LGA package (the object to be connected) and pads provided to a mounting board such as a motherboard to each other.

The substrate 10 includes, as its basic components, a resin substrate 11, wiring layers 12 and 13 and solder resist layers (insulating layers) 16 and 17. The resin substrate 11 forms a substrate main body. The wiring layers 12 and 13 are patterned into their respective desired shapes on two sides of the resin substrate 11, respectively. The solder resist layers (insulating layers) 16 and 17 serving as protection layers are formed in such a manner that the wiring layers 12 and 13 are covered, but portions which are pads 12P and 13P defined at desired positions in the wiring layers 12 and 13 are exposed. The resin substrate 11 is, for example, a wiring board having a multilayer structure formable by a build-up method. The wiring layers 12 and 13 in outermost layers of the resin substrate 11, are electrically connected to each other via wiring layers (in the example shown in FIG. 1, two wiring layers 14) formed as appropriate at desired positions in the substrate and via holes (conductors filled into the via holes: vias 15) connecting the wiring layers 14 to each other.

In addition, solder 18 is laminated on each pad 12P exposed from the solder resist layer 16 formed in one surface (a surface on which the connection terminals 20 are mounted) of the resin substrate 11. The solder 18 is used for bonding of the connection terminals 20 as will be described below. Meanwhile, an external connection terminal (a solder ball 19 in this embodiment) is bonded to each pad 13P exposed from the solder resist layer 17 formed on the other surface (a surface opposite to the surface on which the connection terminals 20 are mounted) of the resin substrate 11. The solder ball 19 is used when the board with connection terminals 40 is mounted on a mounting board such as a motherboard as will be described later.

It is desirable that each of the pads 12P and 13P be subjected to nickel (Ni) plating and gold (Au) plating in this order, before the formation of the solder 18 and the solder ball 19. These are performed in order to improve the contact properties at the time of laminating the solder 18 on the pads 12P and 13P and bonding the solder balls 19, and to prevent Cu from diffusing into the Au plating layer by enhancing the adhesion with metal (typically, copper (Cu)) constituting the pads 12P and 13P.

In addition, the substrate 10 is selected so that the thickness of the substrate main body (the resin substrate 11) can be 0.2 to 1.0 mm, and the height of the external connection terminals (the solder bolls 19) can be 0.2 to 0.5 mm.

Note that the resin substrate 11 is used as the substrate main body in this embodiment, but as a matter of course the form of the substrate main body is not limited to the resin substrate 11. For example, a silicon substrate may be used. Regarding the form of the substrate main body in this case, a plurality of through-holes (with a diameter of approximately 100 μm) are formed in a silicon substrate, and through-hole electrodes are formed by filling an electrically conductive material (for example, Cu) into the through-holes, for example. At this time, the through-hole electrodes are formed so that both end surfaces of each through-hole electrode can be substantially flush with both surfaces of the silicon substrate. In addition, an insulating film (for example, a silicon oxide film) is formed between each of the through-hole electrodes and the substrate main body (the silicon substrate). In the substrate main body (the silicon substrate), the both end surfaces, of the through-hole electrodes, exposed form the surfaces of the substrate correspond to the above-described pads 12P and 13P.

As explicitly shown in FIG. 2, each connection terminal 20 can be mainly divided into four constituent portions of a bonding portion 21, a contacting portion 22, a spring portion 23, and an engaging portion 24, and has a structure in which these portions are integrated together. The connection terminal 20 is made of a metal material having appropriate elasticity (spring characteristics and bendability) and can be fabricated by patterning a thin metal plate having a uniform thickness into a desired shape by stamping or the like, and further subjecting the patterned thin metal plate to bending, as will be described later.

The size of the connection terminal 20 is selected to be 1.5 mm (±0.5 mm) in height H, 1.5 mm (±0.5 mm) in depth D, and 0.1 to 0.5 mm (preferably, 0.2 mm) in width W. In addition, the thin metal plate constituting the connection terminal 20 is selected to have a thickness of approximately 0.08 mm.

The bonding portion 21 is a portion to be fixedly bonded to a corresponding one of the pads 12P of the substrate 10 with the solder 18 (FIG. 1) interposed therebetween. The bonding portion 21 is continuous to one end portion (on the lower side in the example shown in FIGS. 2A and 2B) of the spring portion 23, and has a width (for example, W=0.4 mm) greater than the width of the spring portion 23. Moreover, the bonding portion 21 is formed to have flat surfaces on both sides.

By forming the bonding portion 21 into the above-described shape, it is possible to secure sufficient solder connection when the bonding portion 21 is eventually bonded to the pad 12P of the substrate 10. In other words, it is possible to enhance the degree of adhesion with the pad 12P, which is flat and a counterpart to be bonded. In addition, by making the width of the bonding portion 21 greater than the width of the spring portion 23, it is possible to engage the bonding portion 21 with a recessed portion 32 (see FIGS. 3A to 3C) provided to the housing 30 when the connection terminals 20 is temporarily fixed to the housing 30, as will be described later.

The contacting portion 22 is a portion configured to come into contact with a pad of the object to be connected (the LGA package in this embodiment) which is eventually connected to the board with connection terminals 40. The contacting portion 22 is continuous to the other end portion of the spring portion 23 (on the upper side in the example shown in FIGS. 2A and 2B), and disposed to face the bonding portion 21 when viewed in the height (H) direction. The contacting portion 22 has a width (for example, W=0.2 mm) which is equal to that of the spring portion 23, and is formed to project outwardly (i.e., in a direction away from the bonding portion 21). More specifically, the contacting portion is formed to project outwardly from the spring portion 23 (for example, by 0.3 mm), and to be curved inwardly from the projecting portion like an arc.

By forming the contacting portion 22 into the above-described shape, the following advantages can be achieved. First, the provision of the projecting portion can prevent the end portion (the portion continuous to the contacting portion 22) of the spring portion 23 from coming into contact with the object to be connected, which would otherwise occur because of deformation of the spring portion 23 when the pad of the object to be connected is pressed on the contacting portion 22.

As a result, it is possible to prevent breakage of the connection terminal 20, as well as breakage of the object to be connected. In addition, since a tip end portion of the contacting portion 22 is curved, it is possible to prevent breakage of the pad due to the curved portion when the pad of the object to be connected is pressed on the curved portion.

In addition, because of deformation of the spring portion 23 occurring when the pad of the object to be connected is pressed on the contacting portion 22, the curved portion comes into contact with a surface of the pad with the contacting portion 22 being shifted in a direction toward the bonding portion 21 (i.e., a direction perpendicular to the surface of the pad with which the contacting portion 22 comes into contact). This prevents a large shift (slippage) of the contacting portion 22 on the surface of the pad when the contacting portion 22 comes into contact with the surface of the pad, and hence the pads can be arranged at a narrow pitch.

The spring portion 23 has a width (W=0.2 mm) which is equal to that of the contacting portion 22, and is formed to curve outwardly (i.e., in a direction away from the bonding portion 21 and the contacting portion 22). By forming the spring portion 23 into the above-described shape, the spring portion 23 can elastically deform in the height (H) direction.

The one end portion of the spring portion 23 (on the side continuous to the bonding portion 21) is eventually fixed, whereas the other end portion (on the side continuous to the contacting portion 22) is a free end. For this reason, when the pad of the object to be connected is eventually pressed on the contacting portion 22 and comes into contact therewith, the spring portion 23 contributes to the stable keeping of the contact state between the pad and the contacting portion 22 by means of an elastic force against the pressing force. Note that, actually, the spring portion functions as a "spring" integrally with the contacting portion 22. The spring constant at this time is selected to be, for example, 0.6 to 0.8 N/mm.

The engaging portion 24 is a portion for stabilizing the posture of the connection terminal 20 when the connection terminal 20 is inserted into a slit provided to the housing 30 and temporarily fixed thereto as will be described later. The connection terminal 20 is inserted with the contacting portion 22 positioned on the lower side, as indicated by the arrow in FIG. 2B. This means that when the connection terminal 20 is inserted, the state shown in FIG. 2B is inverted.

The engaging portion 24 is continuous to an end portion of the bonding portion 21 on a side opposite to the side continuous to the spring portion 23, and has a width (W=0.2 mm) which is equal to that of the spring portion 23 (excluding portions which are protruding portions 24a provided midway). In addition, the engaging portion 24 is formed into an inverted "U" shape in a side view. Specifically, the engaging portion 24 is formed to extend upwardly (a direction toward the contacting portion 22) from the bonding portion 21, to be curved from the extending portion like an arc, and further to extend downwardly (in a direction away from the contacting portion 22 from the curved portion). Each protruding portion 24a slightly projecting in a width (W) direction of the engaging portion 24 as shown in FIG. 2A is formed midway in the portion extending downwardly from the curved portion. The protruding portion 24a functions to stabilize the posture of the aforementioned connection terminal 20.

The housing 30 is provided to temporarily fix and align a plurality of connection terminals 20 on the substrate 10 at positions corresponding to the terminal arrangement thereof before the plurality of connection terminals 20 are fixedly mounted on the substrate 10. In other words, the housing 30 serves as a jig for alignment of terminals.

FIGS. 3A to 3C show a configuration of the housing 30, where FIG. 3A shows a plan-view structure of the housing 30 viewed from the side from which the connection terminals 20 are inserted, and FIGS. 3B and 3C show sectional structures viewed along the line A-A' and the line B-B' in FIG. 3A, respectively.

The housing 30 is provided with through-holes (slits) 31 arranged in arrays to meet the arrangement of the pads 12P of the substrate 10 to which the bonding portions 21 of the connection terminals 20 are eventually bonded. The slits 31 are provided for the respective connection terminals 20, respectively. Each slit 31 is formed into a rectangular shape divided into two portions in a plan view (see FIG. 3A). In other words, each slit 31 is divided into a portion having a long length in a long side direction (a large opening portion) 31a and a portion having a short length in the long side direction (a small opening portion) 31b, which have the same length in a short side direction.

The expressions "having a long length in the long side direction", and "having a short length in the long side direction" simply represent the relative relationship between one opening portion 31a (or 31b) and the other opening portion 31b (or 31a) in terms of length in the longitudinal direction of the slit 31.

The length of the slit 31 in the short side direction is selected to be smaller than the width W of the bonding portion 21 of the connection terminal 20, and greater than the width W of each of the other portions (the contacting portion 22, the spring portion 23, and the engaging portion 24 excluding the protruding portions 24a). In addition, the length of the small opening portion 31b in the long side direction is selected to be slightly greater than the length of the engaging portion 24 in the depth (D) direction. The length of the large opening portion 31a in the long side direction is selected to be substantially equal to or slightly greater than the length of the spring portion 23 in the depth (D) direction.

Moreover, the housing 30 is provided with the recessed portion 32 for each of the slits 31. The recessed portion 32 is formed into an "H" shape which straddles the large opening portion 31a and the small opening portion 31b in a plan view. More specifically, the recessed portion 32 includes: a first housing portion located between the large opening portion 31a and the small opening portion 31b; and second housing portions (at two positions) which are portions each extending in the long side direction of the slit 31 and being continuous to both end portions of the first housing portion, and which face to each other in the short side direction.

The "H" shaped recessed portion 32 has a uniform depth. The depth is selected to be slightly greater than the thickness of the bonding portion 21 of the connection terminal 20. The depth is provided for securing a space necessary for eventual soldering, which is performed, as will be described later, on the bonding portions 21 of the connection terminals 20 with the bonding portions 21 being locked to the respective recessed portions 32 when the connection terminals 20 are temporarily fixed to the housing 30.

In addition, the housing 30 is selected to have a thickness of 0.5 to 1.0 mm (preferably 0.8 mm).

Next, description is given of a method for fabricating the board with connection terminals 40 of this embodiment with reference to FIGS. 2 to 6.

First, there are prepared the plurality of connection terminals 20 (FIGS. 2A and 2B) to be mounted on the substrate 10 (to be bonded to the pads 12P of the substrate 10). Those can be fabricated by stamping patterns of the connection terminals 20 to be formed (patterns corresponding to the shapes at the time of being developed in a plane) from a thin metal plate having a uniform thickness (for example 0.08 mm) by using a die, and bending the patterns into desired shapes, although the fabrication is not particularly illustrated. It is also possible to obtain the patterns corresponding to the desired shapes of the connection terminals 20 by etching, instead of the stamping.

As a material for the thin metal plate to be used, there is preferably used a material having an appropriate elasticity (spring characteristics, and bendability), for example, an alloy based on copper (Cu), such as beryllium-copper (Cu—Be), phosphor bronze (Cu—Sn), or a Corson alloy (Cu—Ni—Si—Mg, Cu—Ni—Si, Cu—Ni—Co—Si—Cr or the like).

In addition, after the desired patterns corresponding to the shapes of the connection terminals 20 are obtained by stamping or the etching, a surface of the thin metal plate is subjected to Ni plating, Ni—Co alloy plating, or the like (for example, in a thickness of approximately 1 to 3 μm). Performing plating with an alloy containing cobalt (Co) is useful in that the elasticity can be improved. The Ni plating and the like may be performed before the bending, or after the bending.

Moreover, the surface (at least the bonding portions 21 and the contacting portions 22) subjected to the Ni plating or the like is subjected to gold (Au) plating (for example, the thickness thereof on the bonding portions 21 is approximately 0.03 to 0.05 μm, and the thickness thereof on the contacting portions 22 is a approximately 0.3 to 0.5 μm). This is performed in order to improve the contact properties at the time of the bonding of the bonding portions 21 to the pads 12P of the substrate 10 with the solder 18 interposed therebetween, as will be described later, and to enhance the electrical conductivity at the time of the eventual bringing of the contacting portions 22 into contact with the pads of the object to be connected (the LGA package in the this embodiment). Note that the conductive layer of Ni plating or the like, which is an underlying layer, functions to prevent Cu from diffusing into the Au plating layer by enhancing the adhesion between the base member (the layer of Cu-based alloy) and the Au layer.

Figure 4:
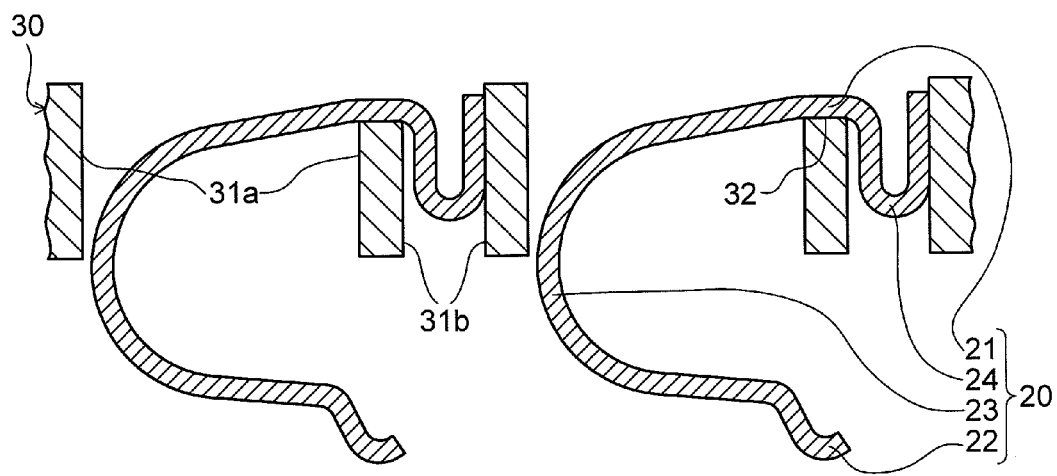
FIG. 4 is a sectional view showing a state where the connection terminals of FIGS. 2A and 2B are inserted into the housing of FIGS. 3A to 3C and temporarily fixed thereto (a state where the connection terminals are aligned)

Next (see FIGS. 3A to 4), the plurality of connection terminals 20 thus fabricated are subjected to a process for temporal fixation thereof to the housing 30, and for alignment thereof. FIG. 4 shows a state where the connection terminals 20 are inserted into and thereby temporarily fixed to a sectional structure (the housing 30) viewed along the line C-C' in FIG. 3A.

The process for the temporal fixation (alignment) can be performed by, for example, a pick & place method using a stitching machine. Specifically, the connection terminals 20 on the thin metal plate (frame) subjected to the stamping (or the etching) and the bending, and converted into the desired shapes are snapped off from the metal frame by bending and picked up (pick). Then, each of the connection terminals 20 is inserted into a corresponding one of the slits 31 provided to the housing 30 (place).

This leads to the temporal fixation of the connection terminals 20 in the respective slits 31 (the large opening portions 31a and the small opening portions 31b) provided to the housing 30. Specifically, the bonding portions 21 of the connection terminals 20 are engaged with the respective recessed portions 32 (FIG. 3A) which are provided for the slits 31, respectively, and are formed to have the "H" shape. Specifically, an inner surface of each bonding portion (a surface facing to the contacting portion 22) comes into contact with a first housing portion located between the large opening portion 31a and the small opening portion 31b of a corresponding one of the slits 31, and the portion, of the bonding portion 21, projecting in the width (W) direction thereof is locked to second housing portions (at the two positions), of the recessed portion 32, extending in the long side direction of the slit 31.

In addition, the engaging portion 24 of each connection terminal 20 is housed in the small opening portion 31b of a corresponding one of the slits 31, and the protruding portions 24a of the engaging portion 24 come into pressure contact with sidewall portions (see FIG. 3B) in the small opening portion 31b, and locked thereto. Meanwhile, regarding the contacting portion 22 and the spring portion 23 of the connection terminal 20, a portion of the spring portion 23 (a portion on the side continuous to the bonding portion 21) is housed in the large opening portion 31a of the slit 31, and the remaining portion of the spring portion 23, as well as the contacting portion 22, is inserted through the large opening portion 31a to extend therebeyond.

The locking by the bonding portion 21 alone is insufficient for the posture of the connection terminals 20 to be stabilized, because there is a slight space between a connection terminal portion (a portion of the spring portions 23) housed in the slit (the large opening portion 31a) and the sidewall portions in the large opening portion 31a. However, by bringing (locking) the protruding portions 24a of the engaging portion 24 into pressure contact with (to) the sidewall portions in the small opening portion 31b, the posture of the connection terminal 20 can be kept stable. In other words, by making the width (W) of each bonding portion 21 relatively large, and by forming each engaging portion 24 into the specific shape, the connection terminals 20 can be temporarily fixed to the housing 30 and aligned in a stable state.

At this temporal fixation, a top surface of each bonding portion 21 is located at a position slightly lower than a top end surface of the housing 30 because the depth of the recessed portions 32 is selected to be slightly greater than the thickness of the bonding portions 21 of the connection terminal 20, as described above.

Next (see FIG. 5), there is prepared the substrate on which the connection terminals 20 temporarily fixed to the housing 30 are fixedly mounted. Regarding the form of the substrate 10, there can be used one using the resin substrate 11 as the substrate main body as described above, one using a silicon substrate, or the like. In this embodiment, one using the resin substrate 11 as shown in figure is used.

Specifically, there is formed, by using the build-up method or the like, the resin substrate 11 of the multilayer structure (including the wiring layers 12 and 13 in the outermost layers, the wiring layers 14 inside the substrate, the vias 15 connecting the wiring layers 14 with each other, and the solder resist layers 16 and 17 coating the wiring layers 12 and 13). Further, the solder 18 is laminated on the pads 12P exposed from the solder resist layer 16 on one side of the resin substrate 11, and the solder balls 19 are bonded to the pads 13P exposed from the solder resist layer 17 on the other side. Thus, the desired substrate 10 is fabricated.

Figure 5:
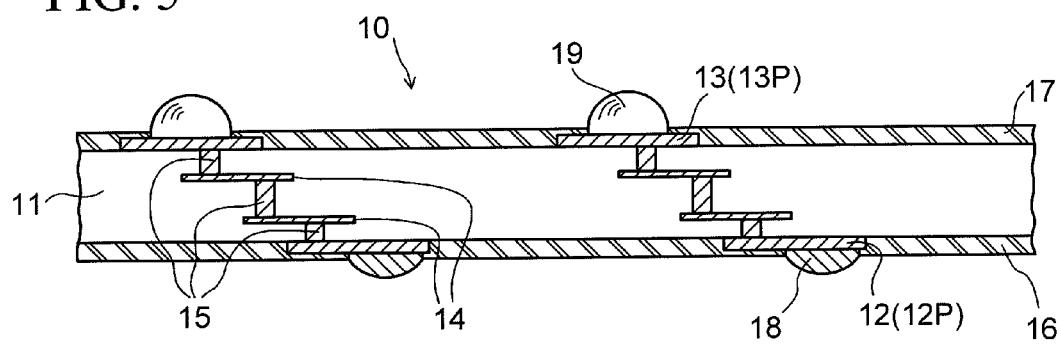
FIG. 5 is a sectional view showing one example of a wiring board to which a structure (the connection terminals temporarily fixed to the housing) shown in FIG. 4 is to be bonded.
Figure 6:
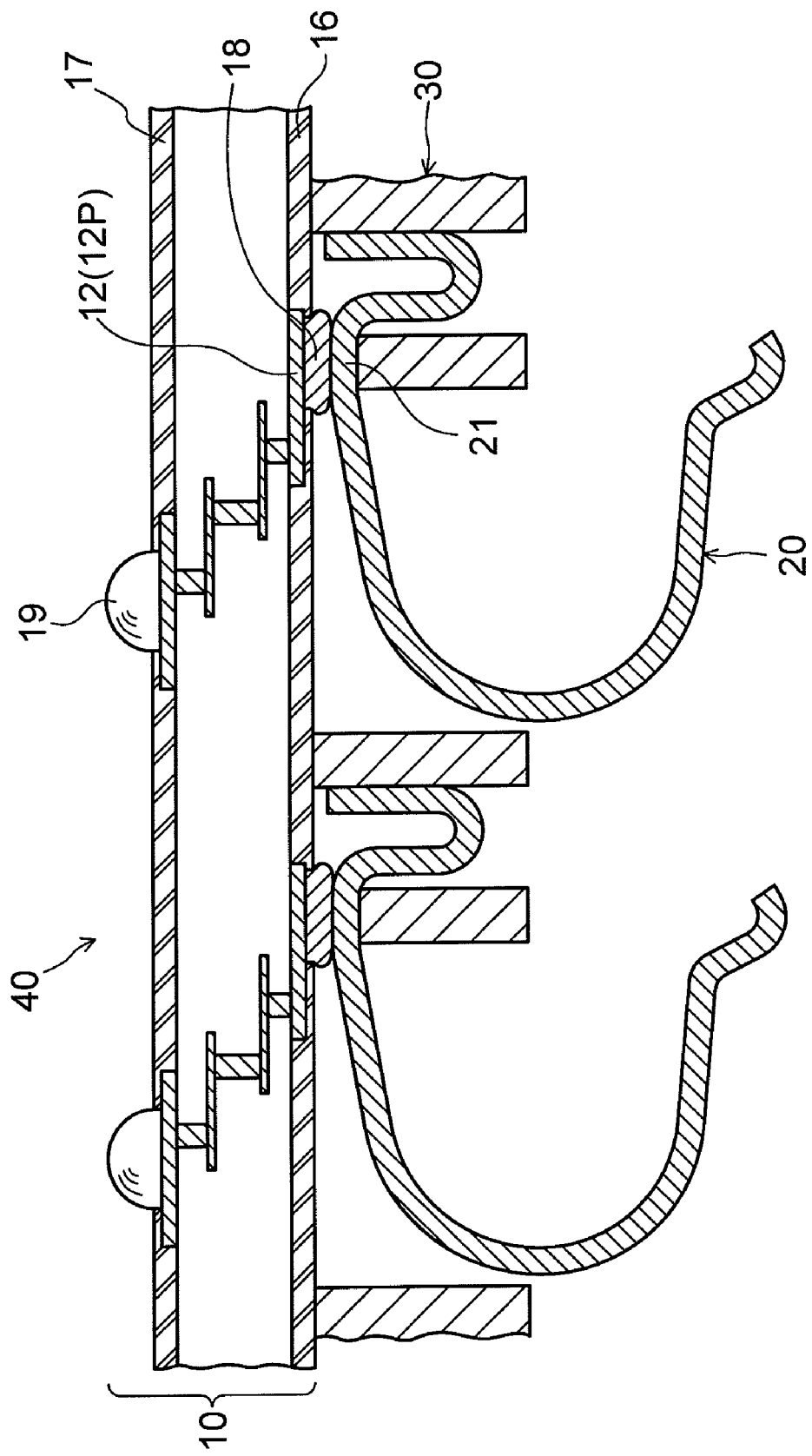
FIG. 6 is a sectional view showing a state where the structure of FIG. 4 is bonded to the wiring board of FIG. 5.

Next (see FIG. 6), the structure fabricated in the process of FIG. 4 (the structure obtained by temporarily fixing the plurality of connection terminals 20 to the housing 30 and aligning the plurality of connection terminals 20) is bonded to the substrate 10 fabricated in the process of FIG. 5. Specifically, the surface of the substrate 10 on the laminated solder 18 side is positioned to face the surface of the housing 30 on the inserted connection terminals 20 side. Then, the solder 18 is brought into contact with corresponding bonding portions 21 of the connection terminals 20, and melt by reflow. Thus, the bonding portions 21 of the connection terminals 20 are electrically connected to the pads 12P of the substrate 10, respectively.

At this time, although a process is not particularly illustrated, the substrate 10 (the solder resist layer 16) and the housing 30 may be mechanically bonded to each other as follows. Specifically, an appropriate amount of an adhesive is applied to portions on the surface facing the substrate 10 of the housing 30, except for regions in which the connection terminals 20 are arranged in advance. The adhesive is melt by the heat at the time of reflow. Thus, the substrate 10 is mechanically bonded to the housing 30.

Note that, in this embodiment, the solder 18 is used as the electrically conductive material for connecting the connection terminals 20 (the bonding portions 21) to the substrate 10 (the pads 12P). However, as a matter of course, the electrically conductive material is not limited to the solder 18, and an electrical conductive resin paste or the like may be used. For example, there can be used a Ag paste obtained by blending a silver (Ag) filler with an insulating resin such as epoxy resin. In this case, the Ag paste laminated on the pads 12P of the substrate 10 is brought into contact with the bonding portions 21 of the connection terminals 20, and then cured by heating. Thus, the pads 12P and the bonding portions 21 are electrically connected to each other.

Through the processes described above, the fabrication of the board with connection terminals 40 of the first embodiment is completed.

Figure 7:
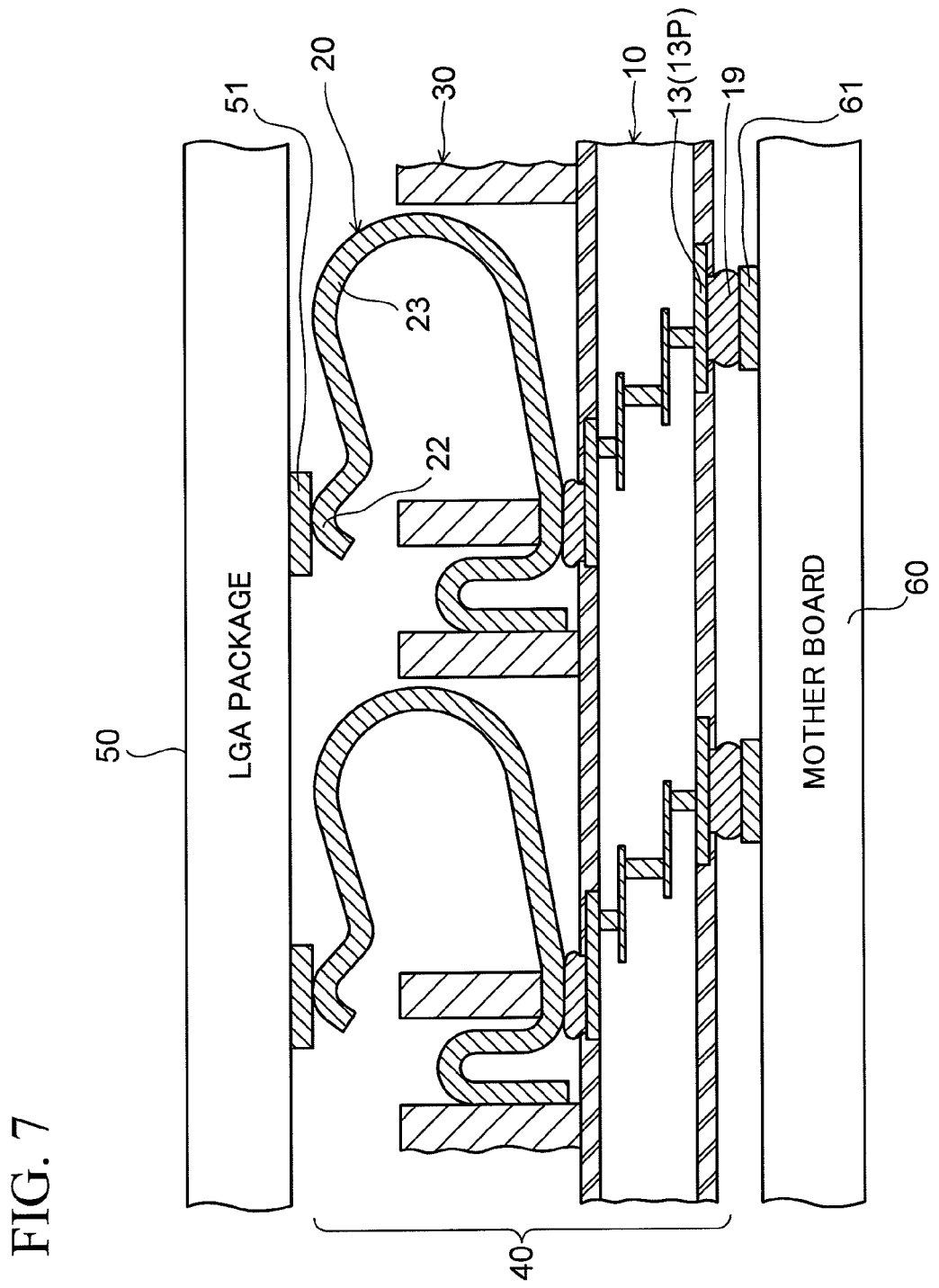
FIG. 7 is a sectional view showing a state where an object to be connected (an LGA package) and a mounting board (a motherboard) are electrically connected to each other with the board with connection terminals of FIG. 1 interposed therebetween.

FIG. 7 shows in a sectional view a state where the object to be connected (an LGA package 50) and a mounting board (a motherboard 60) are electrically connected to each other with the board with connection terminals 40 of the first embodiment interposed therebetween.

The board with connection terminals 40 is connected, via the solder balls 19 bonded to the respective pads 13P disposed on the exposed surface of the substrate 10, to corresponding terminal pads 61 disposed on the motherboard 60.

In addition, the LGA package 50 is, for example, a wiring board of a resin substrate, such as a build-up board. Although not particularly illustrated, the package 50 has a structure basically identical to that of the substrate 10 (FIGS. 1 and 5). However, the solder 18 and the solder balls 19, which are provided to the substrate 10, are not provided to the LGA package 50.

The connection terminals 20 of the board with connection terminals 40 mounted on the motherboard 60 are in contact with the pads 51 exposed from the solder resist layer (not illustrated) on the lower surface side of the LGA package 50 via their respective contacting portions 22. At the contact, a cap attached to an LGA socket (not illustrated) is pressed on a top surface of the LGA package 50. For this reason, the pads 51 on the lower surface side of the LGA package 50 are pressed on the contacting portions 22 of the connection terminals 20, and the pressing force causes the spring portion 23 to be compressed in the height direction (i.e., a direction perpendicular to the surface of the pads 51 with which the contacting portions 22 come into contact) as shown in the figure. As a result, it is possible to increase the contact force between the contacting portions 22 of the connection terminals 20 and the pads 51 of the LGA package 50 (improvement of connection reliability).

As described above, according the configuration of the board with connection terminals 40 and the fabrication method thereof according to the first embodiment, each of the connection terminals 20 includes: the bonding portion 21 bonded to the pad 12P of the substrate 10 with the solder 18 interposed therebetween; the contacting portion 22 which is disposed to face the bonding portion 21 and which is designed to come into contact with the pad 51 provided to the LGA package 50 disposed to face the board with connection terminals 40; the spring portion 23 present between the bonding portion 21 and the contacting portion 22; and the engaging portion 24 extending from the bonding portion 21 and being designed to stabilize the posture of the connection terminal 20 by being engaged with a portion of the slit 31 provided to the housing 30. In addition, these constituent portions 21 to 24 are formed integrally with each other from a metal plate.

In the above-described configuration, the contacting portions 22 (the curved portion) come into contact with the surfaces of the pads 51 with the contacting portions 22 being shifted in a direction toward the bonding portions 21 (i.e., a direction perpendicular to surfaces on which the contacting portions 22 come into contact with the pads 51) by the deformation of the spring portions 23 at the time when the pads 51 of the LGA package 50 are pressed on the contacting portions 22 (see FIG. 7). This prevents the large shift (slippage), as encountered in the related art, of the contacting portions 22 on the pads 51 when the surfaces of the pads 51 come into contact with the contacting portions 22. Hence, it is possible to arrange the pads 51 at a narrow pitch.

In addition, the structure is reinforced by integrating the housing 30 with the substrate 10. Hence, even when the thickness of the substrate 10 on which the connection terminals 20 are fixedly mounted is reduced as much as possible, the occurrence of warp, distortion, and the like can be prevented. In other words, the substrate 10 can be thinned without causing disadvantages as encountered in the related art, such as warp.

Moreover, since the substrate 10 itself can be thinned, the thickness of the housing 30 itself to be integrated with the substrate 10 can be reduced. As a result, the LGA socket itself can be made thin. This is useful in application to, for example, a blade server of a rack type. The state of the art is such that the height from the surface of a mounting board to contact surfaces (top ends of contacting portions) of connection terminals is approximately 4 mm. However, in the configuration of the board with connection terminals 40 according to this embodiment, the height can be made 2 mm or less. In addition, since the thinning shortens the signal transmission path length, signals can be transmitted at high speed.

In addition, since the housing 30, which is integrated with the substrate 10 and functions as a reinforcing member, also functions as a jig for alignment of the terminals, it is possible to easily perform the alignment of the connection terminals 20 on the housing 30 (the temporarily fixation before the mount on the substrate 10). In other words, since the housing 30 on which the connection terminals 20 are aligned are bonded to the substrate 10 as it is, the connection terminals 20 can be directly mounted on the substrate 10 without the use of a jig for alignment, which is used conventionally. This contributes to effective mounting of connection terminals.

Moreover, since it is not necessary to separately prepare a jig for aligning the connection terminals, a process therefor can be eliminated, and the manufacturing process can be simplified.

In addition, in contrast to a structure of a board with connection terminals having been already proposed by the applicants of the present invention (J.P.A. No. 2009-128785) and having a form in which connection terminals are exposed on a substrate, the connection terminals 20 are partially housed in the slits 31 of the housing 30 on the substrate 10 in the structure of the board with connection terminals 40 according to this embodiment. Hence, the board with connection terminals 40 is advantageous in terms of protection of the connection terminals 20.

Second Embodiment . . . see FIGS. 8 to 10b

Figure 8:
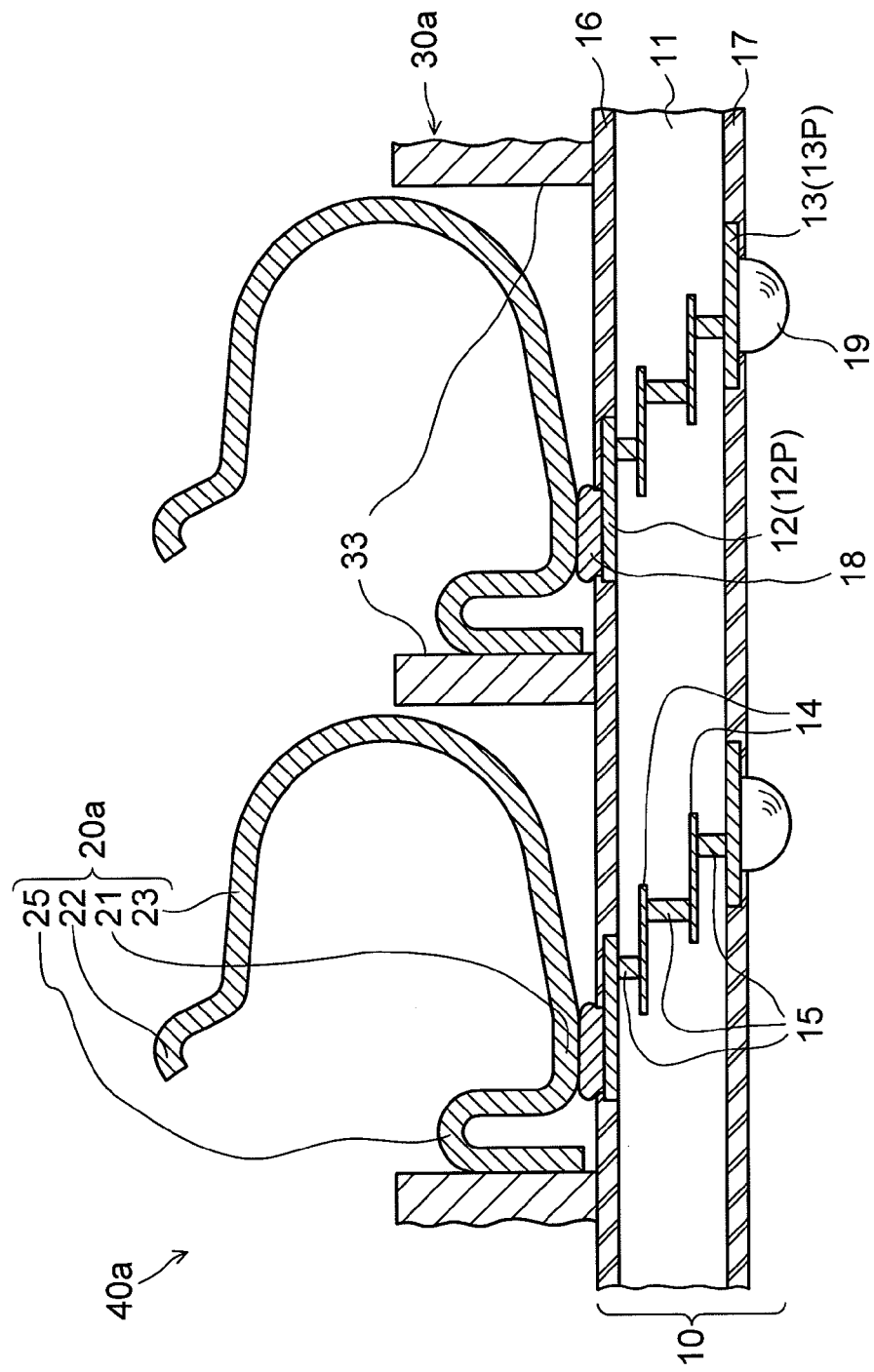
FIG. 8 is a sectional view showing a configuration of a board with connection terminals according to a second embodiment of the present invention.
Figure 9A:
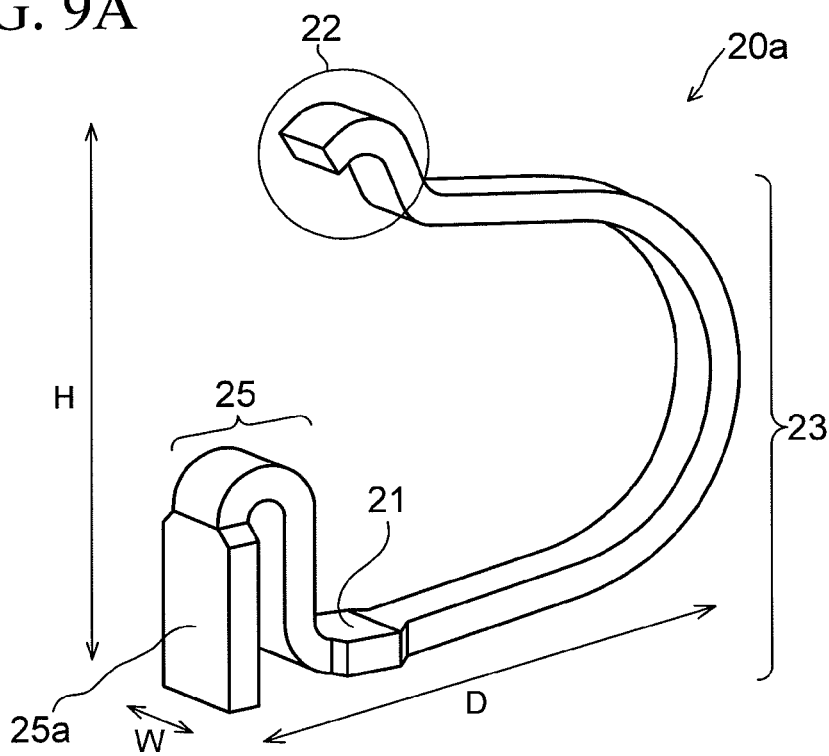
FIGS. 9A and 9B show a structure of the connection terminals used in the board with connection terminals of FIG. 8, where
Figure 9B:
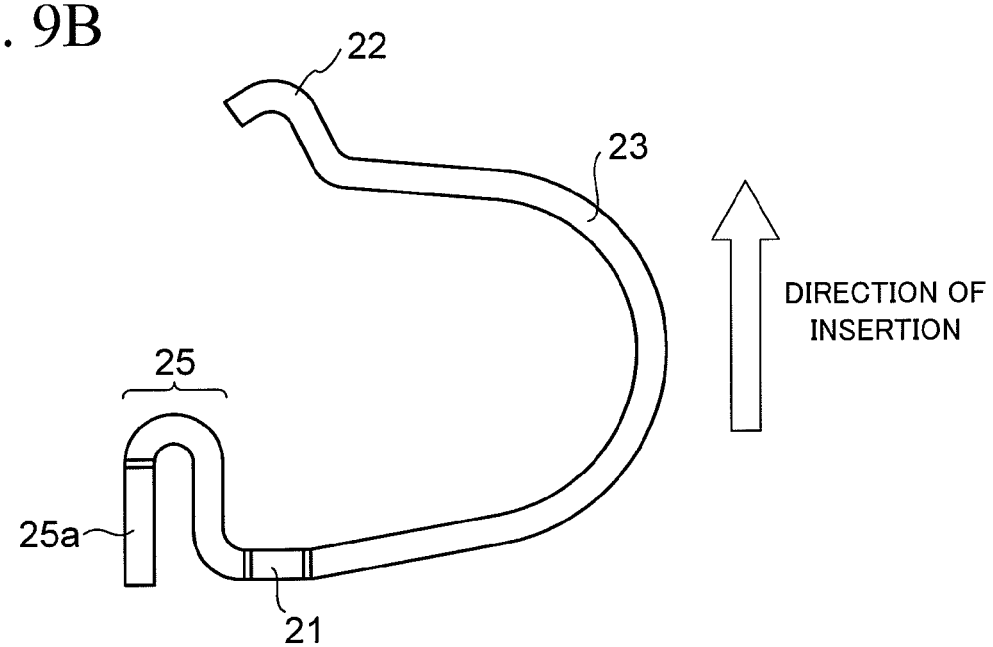
Figure 10A:
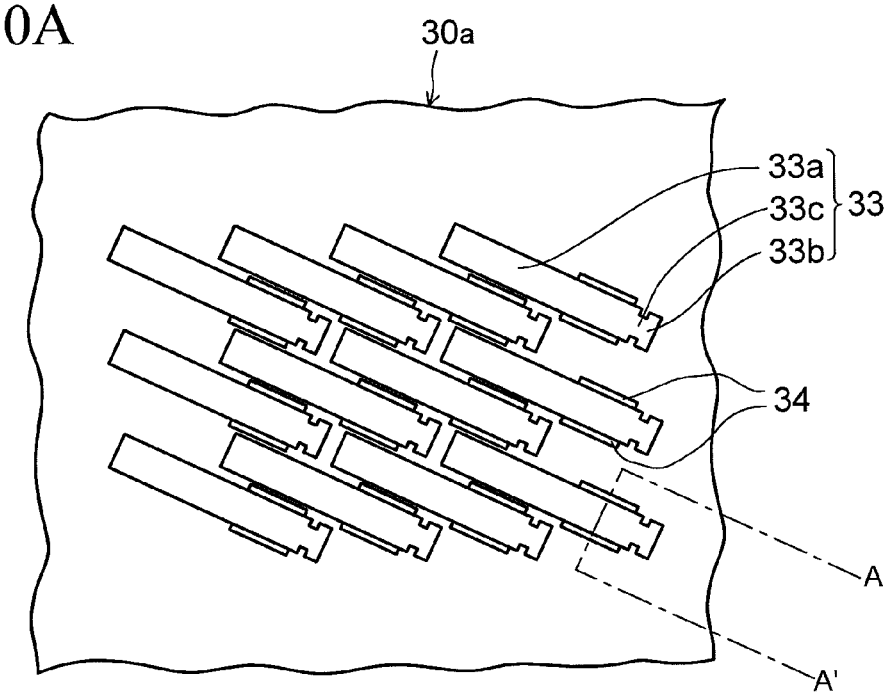
FIGS. 10A and 10B show a configuration of a housing (an insulative plate-like member) for temporarily fixing the connection terminals of FIGS. 9A and 9B, where
Figure 10B:
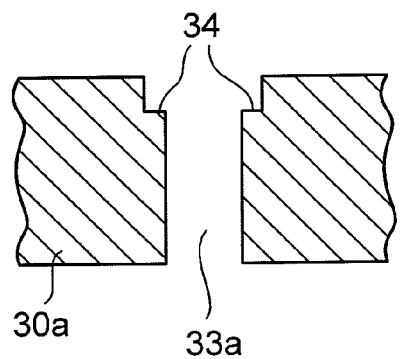

FIG. 8 shows in a sectional view a configuration of a board with connection terminals 40a according to a second embodiment of the present invention. FIGS. 9A and 9B show a structure of a connection terminal 20a used in the board with connection terminals 40a, where FIG. 9A shows the shape of the connection terminal 20a viewed obliquely from above, and FIG. 9B shows the shape thereof in a side view. Meanwhile, FIGS. 10A and 10B show a configuration of a housing 30a for temporarily fixing the connection terminals 20a, where FIG. 10A shows a plan-view structure of the housing 30a viewed from the side from which the connection terminals 20a are inserted, and FIG. 10B shows a sectional structure viewed along the line A-A' of FIG. 10A.

As in the case of the connection terminals 20 (FIGS. 2A and 2B) used in the first embodiment, each of the connection terminals 20a (FIGS. 9A and 9B) used in this second embodiment has a structure in which four portions (the bonding portion 21, the contacting portion 22, the spring portion 23, and an engaging portion 25) are integrated together. Basically, each portion of the connection terminals 20a has the same functions as those of the connection terminals 20, and difference lies in only the shape of the engaging portion 25.

The engaging portion 25 is continuous to an end portion of the bonding portion 21 on a side opposite to the side continuous to the spring portion 23, and has a width (for example, W=0.2 mm) which is equal to that of the spring portion 23 (excluding a portion which is an inserting portion 25a provided in an tip end). In addition, the engaging portion 25 is formed into an inverted "U" shape in a side view. Specifically, the engaging portion 25 is formed to extend upwardly (in a direction toward the contacting portion 22) from the bonding portion 21, to be curved from the extending portion like an arc, and further to extend downwardly (in a direction away from the contacting portion 22) from the curved portion. The portion extending downwardly from the curved portion forms the inserting portion 25a having a width (for example, W=0.3 mm) which is greater than the width of the engaging portion 25, as shown in FIG. 9A. The inserting portion 25a functions to stabilize the posture of the connection terminal 20a temporarily fixed to the housing 30a as will be described later.

As in the case of the first embodiment, the housing 30a (FIG. 10A) used in this second embodiment is provided with slits 33 arranged in arrays to meet the arrangement of pads 12P of the substrate 10 (FIG. 8) to which the bonding portions 21 of the connection terminals 20a are eventually bonded. The slits 33 are provided to the connection terminals 20a, respectively. In this embodiment, each slit 33 is made of a single portion, has a narrow portion 33c midway, and similarly formed into a rectangular shape (see FIG. 10A). In other words, each slit 33 has a portion having a long length in a long side direction (a large opening portion) 33a, and a portion having a short length in the long side direction (a small opening portion) 33b, which have the same length in a short side direction. Moreover, the slit 33 has a communicating portion (the narrow portion) 33c having a width smaller than each of the width of the large opening portion 33a and the width of the small opening portion 33b.

Similarly, the expressions "having a long length in the long side direction" and "having a short length in the long side direction" simply represent the relative relationship between one opening portion 33a (or 33b) and the other opening portion 33b (or 33a) in terms of length in the long side direction of the slit 33.

The length of each of the large opening portion 33a and the small opening portion 33b in the short side direction is selected to be smaller than the width W of the bonding portion 21 of the connection terminal 20a, and to be greater than the width W of each of the other portions (the contacting portion 22, the spring portion 23, and the portion of the engaging portion 25 excluding the inserting portion 25a). In addition, the width of the communicating portion 33c is selected to be substantially equal to the width W of the engaging portion 25 (the portion excluding the inserting portion 25a). Meanwhile, the size of the small opening portion 33b is selected to be substantially equal to the sectional area (a size corresponding to thickness×width) of the inserting portion 25a, and the length of the large opening portion 33a in the long side direction is selected to be substantially equal to or slightly greater than the length of the spring portion and the bonding portion 21 in the depth (D) direction.

As described above, the width of the communicating portion 33c is selected to be substantially equal to the width W of the engaging portion 25 (the portion excluding the inserting portion 25a), and the size of the small opening portion 33b is selected to be substantially equal to the sectional area of the inserting portion 25a. Thereby, when the connection terminals 20a are inserted into the slits 33 of the housing 30a, and are temporarily fixed thereto, it is possible to stabilize the posture of each connection terminal 20a by the inserting portion 25a and the engaging portion 25.

Moreover, the housing 30a is provided with recessed portions 34. The recessed portions 34 are provided for the slits 33, respectively. Each recessed portion 34 is made of housing portions (at two positions) being present in the vicinity of the communicating portion 33c and extending in the long side direction of the large opening portion 33a. The recessed portion 34 has a uniform depth, which is selected to be slightly greater than the thickness of the bonding portion 21 of the connection terminal 20a. As in the case of the above-described first embodiment, the depth is provided for securing a space necessary for eventual soldering, which is performed on the bonding portions 21 of the connection terminals 20a with the bonding portions 21 being locked to the respective recessed portions 34 when the connection terminals 20a are temporarily fixed to the housing 30a.

Likewise, the housing 30a is selected to have a thickness of 0.5 to 1.0 mm (preferably. 0.8 mm).

Also in the second embodiment (the board with connection terminals 40a using the connection terminals 20a and the housing 30a), the like function and advantageous effects to those in the case of the above-described first embodiment can be achieved. This is because the basic configuration and the function achieved by each constituent portion are the same, although the shape of the engaging portion 25 of each connection terminal 20a and the corresponding shape of each slit 33 of the housing slightly differ from those in the above-described first embodiment.

Third Embodiment . . . see FIGS. 11 to 13B

Figure 12A:
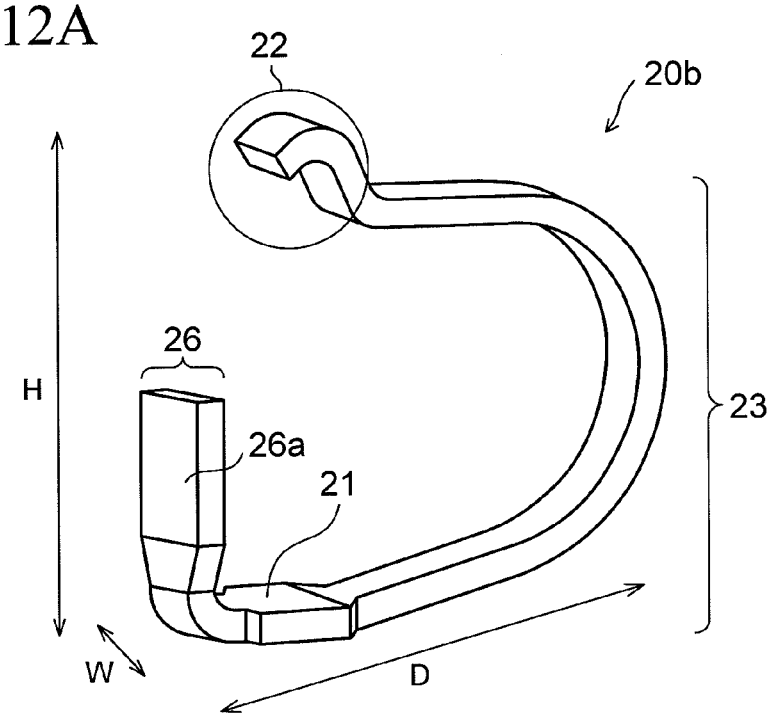
FIGS. 12A and 12B show a structure of the connection terminals used in the board with connection terminals of FIG. 11, where
Figure 12B:
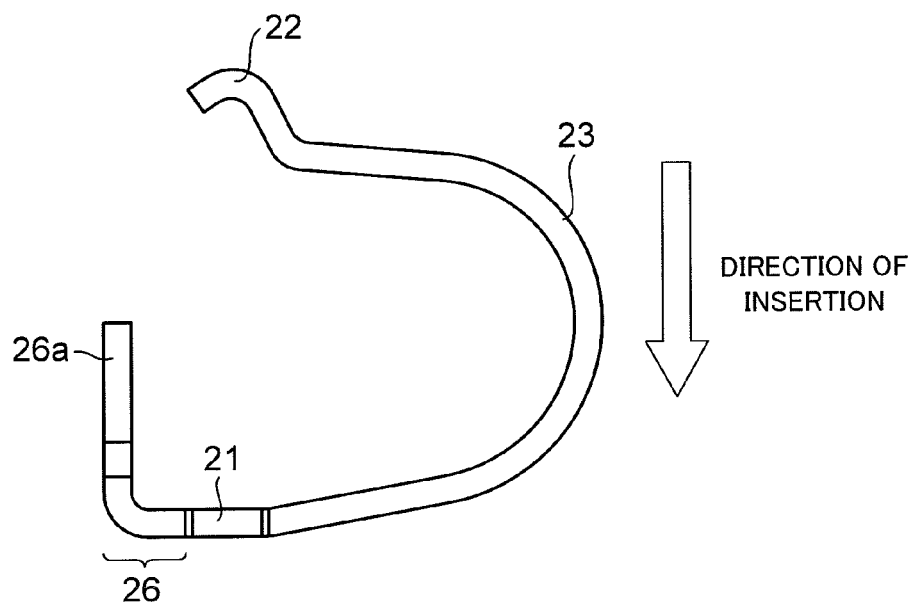
Figure 13A:
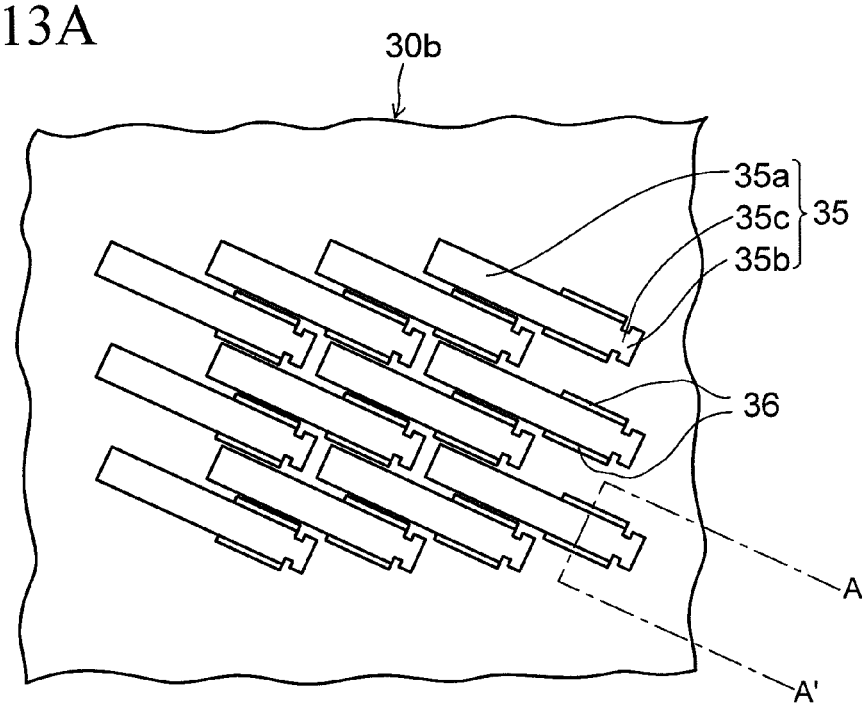
FIGS. 13A and 13B show a configuration of a housing (an insulative plate-like member) for temporarily fixing the connection terminals of FIGS. 12A and 12B, where
Figure 13B:
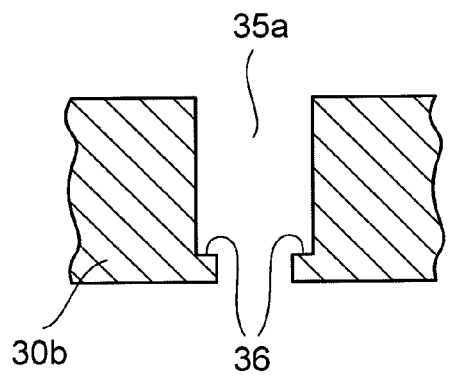

FIG. 11 shows in a sectional view a configuration of a board with connection terminals 40b according to a third embodiment of the present invention. FIGS. 12A and 12B show a structure of a connection terminal 20b used in the board with connection terminals 40b, where FIG. 12A shows the shape of the connection terminal 20b viewed obliquely from above, and FIG. 12B shows the shape thereof in a side view. Meanwhile, FIGS. 13A and 13B show a configuration of a housing 30b for temporarily fixing the connection terminals 20b, where FIG. 13A shows a plan-view structure of the housing 30b viewed from the side from which the connection terminals 20b are inserted, and FIG. 13B shows a sectional structure viewed along the line A-A' of FIG. 13A.

As in the case of the connection terminals 20a (FIGS. 9A and 9B) used in the second embodiment, each of the connection terminals 20b (FIGS. 12A and 12B) used in this third embodiment has a structure in which four portions (the bonding portion 21, the contacting portion 22, the spring portion 23, and an engaging portion 26) are integrated together. Basically, each portion of the connection terminals 20b has the same functions as those of the connection terminals 20a, and difference lies in the shape of the engaging portion 26. In addition, another difference arises from the shape of the engaging portion 26. This difference lies in that each of the connection terminals 20b is inserted into the housing 30b with the bonding portions 21 and the engaging portions 26 positioned on the lower side, as indicated by the arrow in FIG. 12B, i.e., in an opposite direction in the above case.

The engaging portion 26 is continuous to an end portion of the bonding portion 21 on a side opposite to the side continuous to the spring portion 23, and has a width (for example, W=0.2 mm) which is equal to that of the spring portion 23 (excluding a portion which is an inserting portion 26a provided in an tip end). In addition, the engaging portion 26 is formed into an inverted "L" shape in a side view. Specifically, the engaging portion 26 is formed to extend horizontally from the bonding portion 21, to be curved upwardly, and further to extend upwardly (in a direction toward the contacting portion 22) from the curved portion. The portion extending upwardly from the curved portion forms the inserting portion 26a having a width (for example, W=0.3 mm) which is greater than the width of the engaging portion 26, as shown in FIG. 12A. The inserting portion 26a functions to stabilize the posture of the connection terminal 20b temporarily fixed to the housing 30b as will be described later.

As in the case of the second embodiment, the housing 30b (FIG. 13A) used in this third embodiment is provided with slits 35 arranged in arrays to meet the arrangement of pads 12P of the substrate 10 (FIG. 11) to which the bonding portions 21 of the connection terminals 20b are eventually bonded. As in the case of the slits 33 (see FIG. 10A) in the second embodiment, each slit 35 has three portions (a large opening portion 35a, a small opening portion 35b, and a communicating portion 35c) in a plan view.

As in the above-described case, the length of each of the large opening portion 35a and the small opening portion 35b in the short side direction is selected to be smaller than the width W of the bonding portion 21 of the connection terminal 20b, and to be greater than the width W each of the other portions (the contacting portion 22, the spring portion 23, a portion of the engaging portion 26 excluding the inserting portion 26a). In addition, the width of the communicating portion 35c is selected to be substantially equal to the width W of the engaging portion 26 (the portion excluding the inserting portion 26a). In addition, the size of the small opening portion 35b is selected to be substantially equal to the sectional area (a size corresponding to thickness×width) of the inserting portion 26a. The length of the large opening portion 35a in the long side direction is selected to be substantially equal to or slightly greater than the length of the spring portion 23 and the bonding portion 21 in the depth (D) direction.

As described above, the width of the communicating portion 35c is selected to be substantially equal to the width W of the engaging portion 26 (the portion excluding the inserting portion 26a), and the size of the small opening portion 35b is selected to be substantially equal to the sectional area of the inserting portion 26a. Thereby, when the connection terminals 20b are inserted into the slits 35 of the housing 30b, and temporarily fixed thereto, it is possible to stabilize the posture of each connection terminal 20b by the inserting portion 26a and the engaging portion 26.

Moreover, the housing 30b is provided with recessed portions 36. The recessed portions 36 are provided for the slits 35, respectively. Each recessed portion 36 is made of housing portions (at two positions) being present in the vicinity of the communicating portion 35c and extending in the long side direction of the large opening portion 35a. As in the above-described case, the recessed portion 36 has a uniform depth, but the depth is selected to be greater than that in the above-described case (the recessed portion 34 of FIG. 10B). This is because the direction in which the connection terminals 20b are inserted into the housing 30b in the third embodiment is inverted with respect to that in the second embodiment.

Likewise, the housing 30b is selected to have a thickness of 0.5 to 1.0 mm (preferably, 0.8 mm).

Also in the third embodiment (the board with connection terminals 40b using the connection terminals 20b and the housing 30b), the like function and advantageous effects to those in the cases of the above-described first and second embodiments can be achieved. This is because the basic configuration and the function achieved by each constituent portion are the same, although the shape of the engaging portion 26 of each connection terminal 20b and the corresponding shape of each slit 35 of the housing 30b slightly differ from those in the above-described first and second embodiments.

In each of the above-described first to third embodiments, there is described as an example the case where the board with connection terminals 40 (FIG. 1) is applied as a part of the LGA socket. However, as a matter of course, the form of application of the board with connection terminals of the present invention is not limited to such cases, as is apparent from the gist (that the housing 30 (30a, 30b) to be integrated with the substrate 10 and to be used for fixedly holding the connection terminals 20 (20a, 20b) is used as a jig for alignment of the connection terminals 20 (20a, 20b) before the integration of the substrate 10) of the present invention). For example, the board with connection terminals can be similarly applied to an interposer, a semiconductor package, or the like.

Figure 14:
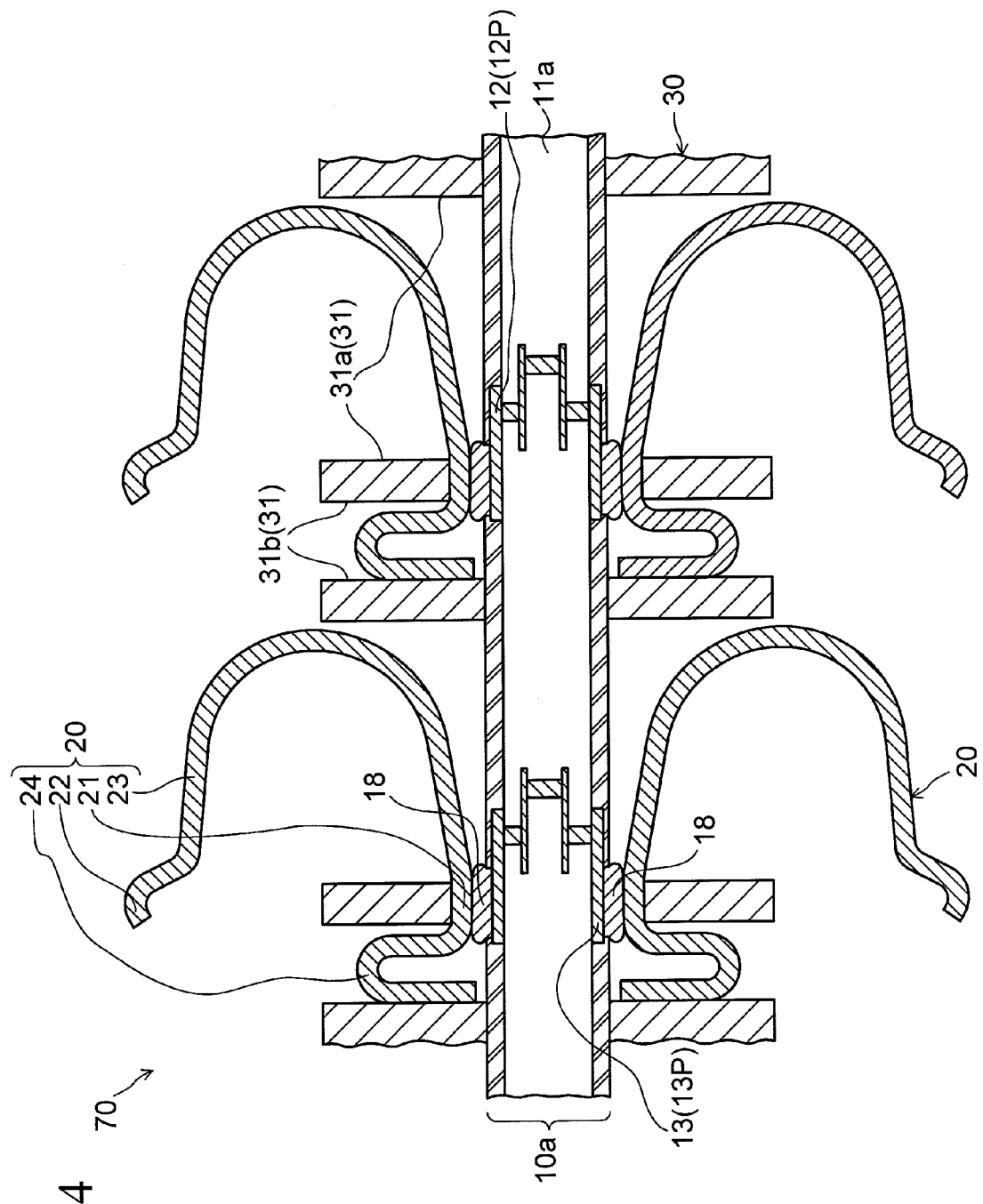
FIG. 14 is a sectional view showing a configuration in a case where a board with connection terminals is applied as an interposer.

FIG. 14 shows an example thereof, and shows a configuration (a sectional view) of a case where the board with connection terminals is applied as an interposer. In the configuration of the board with connection terminals (interposer) 70 shown in FIG. 14, structures (obtained by temporarily fixing the plurality of connection terminals 20 to the housing 30, and aligning the connection terminals 20) as fabricated in the process of FIG. 4 in the first embodiment are bonded to each side of a substrate 10a.

The substrate 10a has basically the same configuration as the configuration of the substrate 10 (FIGS. 1 and 5) in the first embodiment. However, difference lies in the arrangement of the wiring layers and the vias connecting the wiring layers which are provided inside the substrate main body (the resin substrate) 11a. In addition, the solder balls (the external connection terminals) 19 provided to the substrate 10 in the first embodiment are not provided, but instead the solder 18 is laminated on the pads 13P.

The board with connection terminals (interposer) 70 can be used in a mode similar to that of the board with connection terminals 40 in the mounting structure shown in FIG. 7. For example, the connection terminals 20 on an upper side of the substrate 10a are used for connection to the pads 51 of the LGA package 50 via the contacting portions 22 thereof, and the connection terminals 20 on a side opposite to the upper side (a lower side) are used for connection to pads 61 of a motherboard 60 via the contacting portions 22 thereof.

What is claimed is:

1. A board with connection terminals comprising:
a substrate having pads provided on one surface thereof;
connection terminals mounted on the substrate; and
a plate-like member having slits into which the connection terminals are partially inserted, the plate-like member being provided on the one surface of the substrate and fixedly holding the connection terminals,
wherein each of the connection terminals includes:
a bonding portion bonded to one of the pads with an electrically conductive material;
a contacting portion disposed to face the bonding portion;
a spring portion present between the bonding portion and the contacting portion; and
an engaging portion extending from the bonding portion and engaging with one of the slits provided in the plate-like member, and
the contacting portion, the spring portion, the bonding portion and the engaging portion are formed integrally with each other from a metal plate, and
wherein the plate-like member has a recessed portion formed by portions which extend in a long side direction of the slit and which face each other in a short side direction of the slit, and the connection terminal is electrically connected to the pad of the substrate with the bonding portion being locked to the recessed portion.

2. The board with connection terminals according to claim 1, wherein the engaging portion of each of the connection terminals is formed to include: a first portion extending from the bonding portion in a planer direction which is the same as that of the bonding portion; a second portion curved like an arc from the first portion; and a third portion extending from the second portion in a direction toward the contacting portion, the third portion being formed as an inserting portion having a width greater than a width of the engaging portion.

3. The board with connection terminals according to claim 2, wherein each of the slits provided in the plate-like member includes: a first opening portion having a long length in a long side direction of the slit; a second opening portion having a short length in the long side direction of the slit; and a third opening portion having a width smaller than a width of each of the first and second opening portions, and communicating between the first and second opening portions, and
wherein the width of the third opening portion is selected to be substantially equal to the width of the engaging portion, and a size of the second opening portion is selected to be a size corresponding to a thickness and a width of the inserting portion.

4. The board with connection terminals according to claim 1, wherein the engaging portion of each of the connection terminals is formed to include: a first portion extending from the bonding portion in a direction toward the contacting portion; a second portion curved like an arc from the first portion; and a third portion extending from the second portion in a direction away from the contacting portion, and a protruding portion projecting in a width direction of the engaging portion is formed midway in the third portion.

5. The board with connection terminals according to claim 4, wherein each of the slits provided in the plate-like member is divided into a first opening portion having a long length in a long side direction of the slit, and a second opening portion having a short length in the long side direction of the slit, and
wherein a surface, on a side facing the contacting portion, of the bonding portion of a corresponding one of the connection terminals, is in contact with a portion of the plate-like member between the first opening portion and the second opening portion, and portions of the bonding portion, projecting in the width direction thereof, are locked to portions extending in the long side direction of the slit and facing each other in the short side direction of the slit.

6. The board with connection terminals according to claim 5, wherein the engaging portion of the connection terminal is housed in the second opening portion, and the protruding portion formed in the engaging portion is in contact with a sidewall portion in the second opening portion and locked thereto.

7. The board with connection terminals according to claim 1, wherein the engaging portion of each of the connection terminals is formed to include: a first portion extending from the bonding portion in a direction toward the contacting portion; a second portion curved like an arc from the first portion; and a third portion extending from the second portion in a direction away from the contacting portion, the third portion being formed as an inserting portion having a width greater than a width of the engaging portion.

8. The board with connection terminals according to claim 7, wherein each of the slits provided in the plate-like member includes: a first opening portion having a long length in a long side direction of the slit; a second opening portion having a short length in the long side direction of the slit; and a third opening portion having a width smaller than a width of each of the first and second opening portions, and communicating between the first and second opening portions, and
wherein the width of the third opening portion is selected to be substantially equal to the width of the engaging portion, and a size of the second opening portion is selected to be a size corresponding to a thickness and a width of the inserting portion.

9. The board with connection terminals according to claim 1, wherein the plate-like member is a part of a housing for housing the object to be connected, and is integrated with the substrate to thereby form a portion of a socket.

10. The board with connection terminals according to claim 1, wherein the contacting portion is designed to come into contact with a pad provided on an object to be connected which is to be disposed to face the board with connection terminals.

* * * * *